United States Patent [19]
Lee et al.

[11] Patent Number: 5,865,900
[45] Date of Patent: Feb. 2, 1999

[54] ETCH METHOD FOR REMOVING METAL-FLUOROPOLYMER RESIDUES

[75] Inventors: Chiarn-Lung Lee; Huai-Jen Shu; Ying-Tzu Yen, all of Hsin-Chu, Taiwan

[73] Assignee: Taiwan Semiconductor Manufacturing Company, Ltd., Hsin-Chu, Taiwan

[21] Appl. No.: 725,805

[22] Filed: Oct. 4, 1996

[51] Int. Cl.$^6$ .................... H01L 21/3065; H01L 21/306; C23G 1/02
[52] U.S. Cl. .............. 134/12; 134/1.1; 134/1.3; 438/704; 438/725; 438/906; 216/67; 216/109
[58] Field of Search ............... 134/1.1, 1.2, 1.3; 438/725, 906, 704; 216/67, 109

[56] References Cited

U.S. PATENT DOCUMENTS

| | | | |
|---|---|---|---|
| 3,867,216 | 2/1975 | Jacob | 438/725 |
| 3,940,506 | 2/1976 | Heinecke | 438/695 |
| 4,923,828 | 5/1990 | Gluck et al. | 134/1.2 |
| 5,053,104 | 10/1991 | Babu et al. | 438/714 |
| 5,326,427 | 7/1994 | Jerbic | 156/643 |
| 5,376,234 | 12/1994 | Yanagida | 156/662 |
| 5,413,670 | 5/1995 | Langan et al. | 134/1.2 |
| 5,417,826 | 5/1995 | Blalock | 204/176 |
| 5,419,805 | 5/1995 | Jolly | 156/643.1 |
| 5,480,492 | 1/1996 | Udagawa et al. | 134/2 |
| 5,533,635 | 7/1996 | Man | 216/67 |
| 5,597,983 | 1/1997 | Nguyen et al. | 174/264 |
| 5,679,211 | 10/1997 | Huang | 438/697 |
| 5,693,147 | 12/1997 | Ward et al. | 134/1.1 |

*Primary Examiner*—Anthony Green
*Attorney, Agent, or Firm*—George O. Saile; Stephen B. Ackerman; Alek P. Szecsy

[57] ABSTRACT

A method for removing a metal-fluoropolymer residue from an integrated circuit structure within an integrated circuit. There is first provided an integrated circuit having formed therein a metal-fluoropolymer residue. The metal-fluoropolymer residue is formed from a first plasma etch method employing a fluorocarbon containing etchant gas composition within the presence of a conductor metal layer within the integrated circuit. The metal-fluoropolymer residue is then exposed to a second plasma etch method employing a chlorine containing etchant gas composition to form from the metal-fluoropolymer residue a chlorine containing plasma treated metal-fluoropolymer residue. Finally, the chlorine containing plasma treated metal-fluoropolymer residue is removed from the integrated circuit through a stripping method sequentially employing an aqueous acid solution followed by an organic solvent.

18 Claims, 5 Drawing Sheets

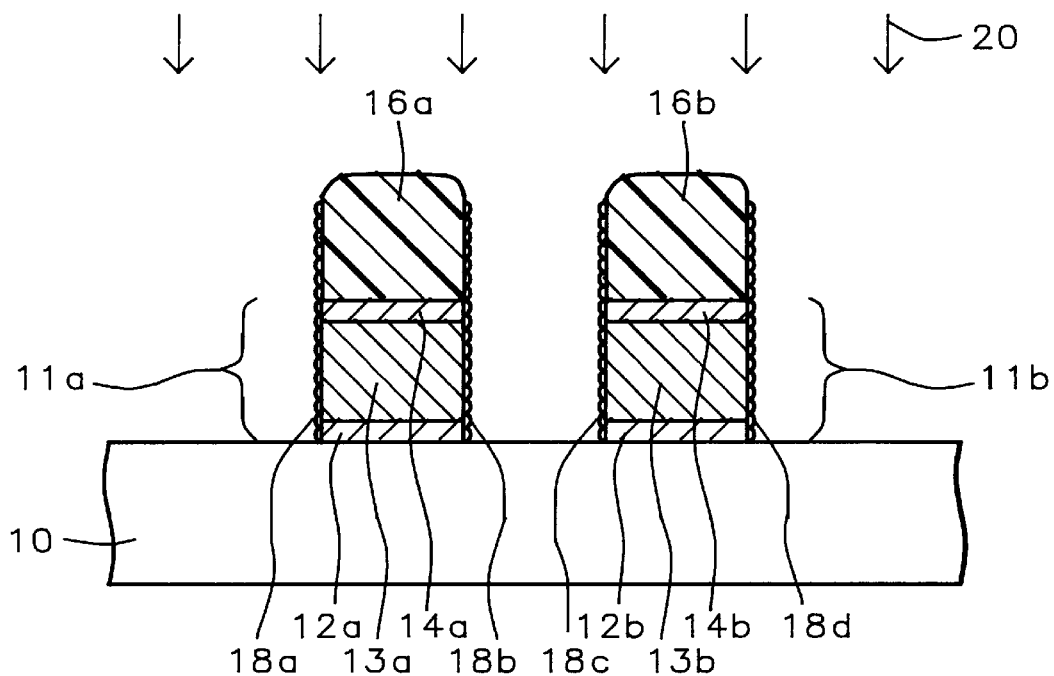
FIG. 1 – Prior Art
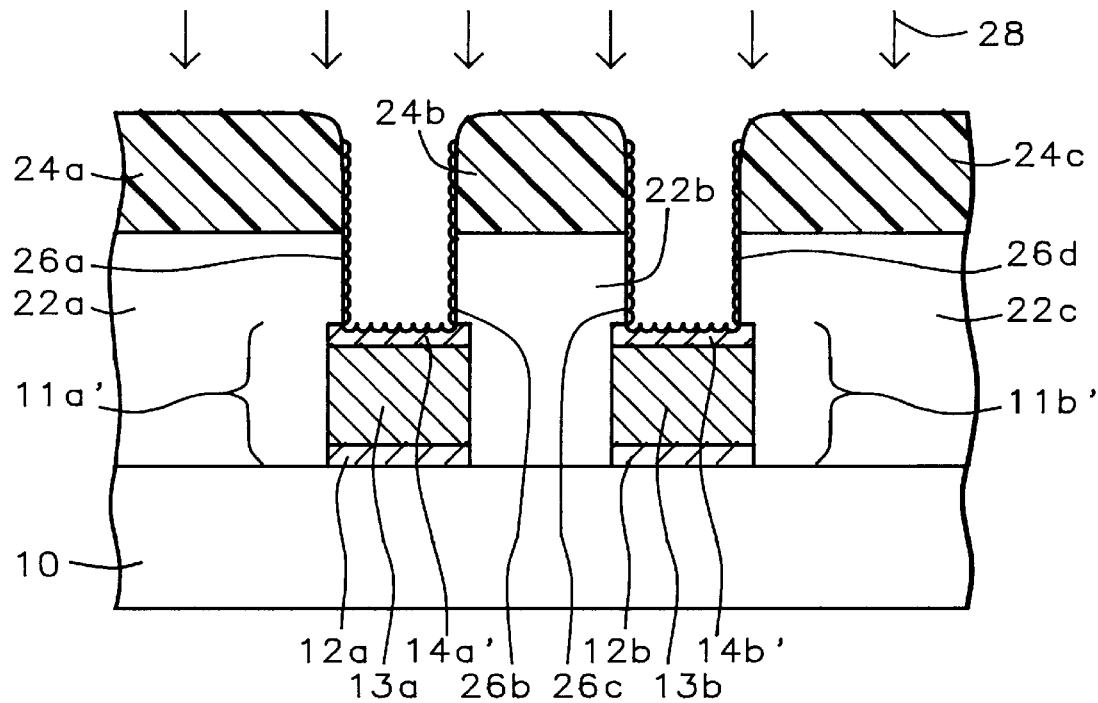
FIG. 2 – Prior Art

ETCH METHOD FOR REMOVING METAL-FLUOROPOLYMER RESIDUES

BACKGROUND OF THE INVENTION

1. Field of the Invention

The present invention relates generally to etch methods employed in forming integrated circuits. More particularly, the present invention relates to etch methods for removing metal-fluoropolymer plasma etch residues from integrated circuit structures when forming integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by patterned dielectric layers.

In the process of forming within integrated circuits patterned conductor layers in contact with patterned dielectric layers, such as but not limited to patterned silicon oxide dielectric layers and patterned silicon nitride dielectric layers, while employing plasma etch methods using fluorocarbon containing etchant gas compositions (such as but not limited to carbon tetrafluoride and/or tri-fluoromethane containing etchant gas compositions) in forming those patterned conductor layers or patterned dielectric layers, it is known in the art that metal-fluoropolymer residues typically form on the sidewalls of the patterned conductor layer and/or the patterned dielectric layer. Two examples of locations where metal-fluoropolymer residues are formed incident to forming patterned conductor layers within integrated circuits are illustrated in FIG. 1 and FIG. 2.

Shown in FIG. 1 is an integrated circuit structure comprising a substrate layer 10 which is typically, although not exclusively, formed of a silicon oxide dielectric material or a silicon nitride dielectric material. Formed upon the substrate layer 10 is a pair of patterned conductor stack layers 11a and 11b which is comprised of a pair of patterned lower barrier layers 12a and 12b having formed and aligned thereupon a pair of patterned conductor layers 13a and 13b which in turn have formed and aligned thereupon a pair of patterned anti-reflective coating (ARC) layers 14a and 14b. The pair of patterned lower barrier layers 12a and 12b and the pair of anti-reflective coating (ARC) layers 14a and 14b are typically formed of a titanium containing material such as, but not limited to, titanium metal, titanium nitride or titanium-tungsten alloy. The pair of patterned conductor layers 13a and 13b is typically formed of an aluminum containing conductor material, most commonly an aluminum alloy. When patterning the patterned conductor stack layers 11a and 11b from a corresponding blanket conductor stack layer comprised of a blanket conductor layer formed interposed between a blanket lower barrier layer and a blanket anti-reflective coating (ARC) layer formed beneath a pair of patterned first photoresist layers 16a and 16b, the blanket conductor layer when formed of an aluminum containing conductor material is typically patterned in a chlorine containing plasma, while the blanket lower barrier layer and the blanket anti-reflective coating (ARC) layer when formed of a titanium containing material are typically patterned in a fluorocarbon containing plasma, such as a first fluorocarbon containing plasma 20 as illustrated in FIG. 1. The first fluorocarbon containing plasma 20 typically comprises a fluorocarbon etchant gas composition such as, but not limited to, carbon tetrafluoride, often with additional sulfur hexafluoride. When forming the patterned lower barrier layers 12a and 12b from the blanket lower barrier layer while employing the first fluorocarbon containing plasma 20, there is typically formed a series of first metal-fluoropolymer residues 18a, 18b, 18c and 18d adjoining the sidewalls of the patterned conductor stack layers 11a and 11b and the patterned photoresist layers 16a and 16b. The first metal-fluoropolymer residues 18a, 18b, 18c and 18d are typically comprised chemically of carbon, fluorine, silicon and metal residues, although silicon may be absent under circumstances where the substrate layer 10 does not contain silicon.

Referring now to FIG. 2, there is shown the results of further processing of the integrated circuit structure whose schematic cross-sectional diagram is illustrated in FIG. 1. Shown in FIG. 2 is the presence of a series of patterned inter-metal dielectric (IMD) layers 22a, 22b and 22c formed upon the integrated circuit structure whose schematic cross-sectional diagram is illustrated in FIG. 1. The series of patterned inter-metal dielectric (IMD) layers 22a, 22b and 22c defines a pair of apertures which accesses the surfaces of a pair of etched patterned conductor stack layers 11a' and 11b'. The pair of apertures defined by the series of patterned inter-metal dielectric (IMD) layers 22a, 22b and 22c is typically formed through plasma etching of a blanket inter-metal dielectric (IMD) layer (not shown) within a second fluorocarbon containing plasma 28 while employing a series of patterned second photoresist layers 24a, 24b and 24c as a second etch mask layer. The second fluorocarbon containing plasma 28 also typically comprises a fluorocarbon etchant gas composition such as, but not limited to, carbon tetrafluoride and/or trifluoromethane. When forming the patterned inter-metal dielectric (IMD) layers 22a, 22b and 22c while employing the second fluorocarbon containing plasma 28, there is typically formed a series of second metal-fluoropolymer residues 26a, 26b, 26c and 26d upon the sidewalls of the apertures defined by the patterned second photoresist layers 24a, 24b and 24c, and the patterned inter-metal dielectric (IMD) layers 22a, 22b and 22c. The series of second metal-fluoropolymer residues 26a, 26b, 26c and 26d typically has a chemical composition similar to the chemical composition of the series of first metal-fluoropolymer residues 18a, 18b, 18c and 18d as illustrated in FIG. 1, where the metal content is derived from at least a partial etching of the patterned anti-reflective coating (ARC) layers 14a and 14b to form the etched patterned anti-reflective coating (ARC) layers 14a' and 14b'.

While metal-fluoropolymer residues, such as the series of first metal-fluoropolymer residues 18a, 18b, 18c and 18d and the series of second metal-fluoropolymer residues 26a, 26b, 26c and 26d, are commonly encountered when forming integrated circuit structures similar to the integrated circuit structures whose schematic cross-sectional diagrams are illustrated in FIG. 1 and FIG. 2, metal-fluoropolymer residues are nonetheless problematic in fabricating further integrated circuit structures upon the integrated circuit structures whose schematic cross-sectional diagrams are illustrated in FIG. 1 and FIG. 2. In particular, metal-fluoropolymer residues are known within the art of integrated circuit fabrication to cause problems within integrated circuits, including but not limited to overlayer adhesion problems and contact resistance problems, when forming additional integrated circuit structures upon integrated circuit structures similar to the integrated circuit structures whose schematic cross-sectional diagrams are illustrated in FIG. 1 and FIG. 2.

Thus, it is desirable in the art of integrated circuit fabrication to provide methods and materials through which metal-fluoropolymer residues, such as the series of first metal-fluoropolymer residues 18a, 18b, 18c and 18d and the series of second metal-fluoropolymer residues 26a, 26b, 26c and 26d, may be efficiently removed from integrated circuit structures such as the integrated circuit structures whose schematic cross-sectional schematic diagrams are illustrated in FIG. 1 and FIG. 2. It is towards that goal that the present invention is generally directed.

Various novel and selective plasma etch methods employing halogen and halocarbon etchant gas compositions have been disclosed in the art. For example, Jerbic in U.S. Pat. No. 5,326,427 discloses a down-stream plasma etch method for selectively etching titanium containing layers in the presence of aluminum and/or silicon oxide layers. The method employs an atomic chlorine and/or atomic fluorine etchant gas composition. In addition, Yanagida in U.S. Pat. No. 5,376,234 discloses for use within a plasma etchant gas composition for etching silicon containing layers within integrated circuits mercaptans, thioethers and disulfides having fluorocarbon side chains. Such fluorocarbon substituted mercaptans, thioethers and disulfides provide plasma etch methods with increased etch rates for silicon containing layers and with decreased residue formation. Finally, Jolly in U.S. Pat. No. 5,419,805 discloses a method for selectively etching within an integrated circuit a refractory metal nitride layer with respect to a refractory metal silicide layer. The method employs a selected halocarbon etchant gas, a substrate temperature within a narrow range and an ion energy within a low limit.

Desirable in the art are additional methods through which metal-fluoropolymer residues may be removed from integrated circuit structures within integrated circuits. Particularly desirable are methods with minimal process complexity through which metal-fluoropolymer residues may be removed from integrated circuit structures within integrated circuits.

SUMMARY OF THE INVENTION

A first object of the present invention is to provide a method for removing from an integrated circuit structure within an integrated circuit a metal-fluoropolymer residue.

A second object of the present invention is to provide a method in accord with the first object of the present invention, which method has minimal process complexity.

A third object of the present invention is to provide a method in accord with the first object of the present invention and the second object of the present invention, which method is readily manufacturable.

In accord with the objects of the present invention, there is provided by the present invention a method for removing from an integrated circuit structure within an integrated circuit a metal-fluoropolymer residue. To practice the method of the present invention, there is first provided an integrated circuit having formed therein an integrated circuit structure having formed thereupon a metal-fluoropolymer residue. The metal-fluoropolymer residue is formed within a first plasma etch method employing a fluorocarbon containing etchant gas composition within the presence of a conductor metal layer within the integrated circuit. The metal-fluoropolymer residue is then exposed to a second plasma etch method employing a chlorine containing etchant gas composition to form from the metal-fluoropolymer residue a chlorine containing plasma treated metal-fluoropolymer residue. Finally, the chlorine containing plasma treated metal-fluoropolymer residue is removed from the integrated circuit structure through a stripping method sequentially employing an aqueous acid followed by an organic solvent.

The present invention provides a method for removing from an integrated circuit structure within an integrated circuit a metal-fluoropolymer residue. Although the mechanism through which the second plasma etch method employing the chlorine containing etchant gas composition modifies the metal-fluoropolymer residue when forming the chlorine containing plasma treated metal-fluoropolymer residue is not clear, it is nonetheless clear that the chlorine containing plasma treated metal-fluoropolymer residue may be readily removed from the integrated circuit structure within the integrated circuit through a stripping method sequentially employing an aqueous acid solution followed by an organic solvent.

The method of the present invention is readily manufacturable and of minimal process complexity. Methods and materials through which may be formed chlorine containing plasmas are generally known in the art of integrated circuit fabrication. Thus, the method of the present invention is readily manufacturable. In addition, the method of the present invention may be practiced through providing only one additional plasma etch step within a multi-step plasma etch and wet chemical stripping method which is otherwise conventional in the art of integrated circuit fabrication. Thus, the method of the present invention is of minimal process complexity.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating a pair of locations where there is formed within an integrated circuit structure two separate series of metal-fluoropolymer residues incident to forming a pair of patterned conductor stack layers within the integrated circuit structure through methods as are conventional in the art.

DESCRIPTION OF THE PREFERRED EMBODIMENT

The present invention provides a method for removing from integrated circuit structures within integrated circuits metal-fluoropolymer residues which are formed through a first plasma etch method employing a fluorocarbon containing etchant gas composition (such as a carbon tetrafluoride (with optional sulfur hexafluoride) and/or a trifluoromethane containing etchant gas composition) in the presence of a conductor metal layer within the integrated circuit. The method of the present invention accomplishes this goal by exposing the metal-fluoropolymer residue to a second plasma etch method employing a chlorine containing etchant gas composition to form from the metal-fluoropolymer residue a chlorine containing plasma etched metal-fluoropolymer residue. The chlorine containing plasma etched metal-fluoropolymer residue may then be removed from the integrated circuit structure within the integrated circuit through a stripping method sequentially employing an aqueous acid solution followed by an organic solvent.

The method of the present invention may be employed in removing metal-fluoropolymer residues from various locations within integrated circuits. The method of the present invention may be employed in removing metal-fluoropolymer residues from locations within integrated circuits including but not limited to patterned conductor metal layer sidewalls within integrated circuits and patterned dielectric layer via sidewalls within integrated circuits. In addition, the method of the present invention may be employed in removing metal-fluoropolymer residues from integrated circuit structures within various types of integrated circuits. The method of the present invention may be employed in removing metal-fluoropolymer residues from integrated circuit structures within integrated circuits including but not limited to dynamic random access memory (DRAM) integrated circuits, static random access memory (SRAM) integrated circuits, integrated circuits having within their fabrications field effect transistors (FETs), integrated circuits having within their fabrications bipolar transistors and integrated circuits having within their fabrications bipolar complementary metal oxide semiconductor (BiCMOS) transistors.

Figure 3:
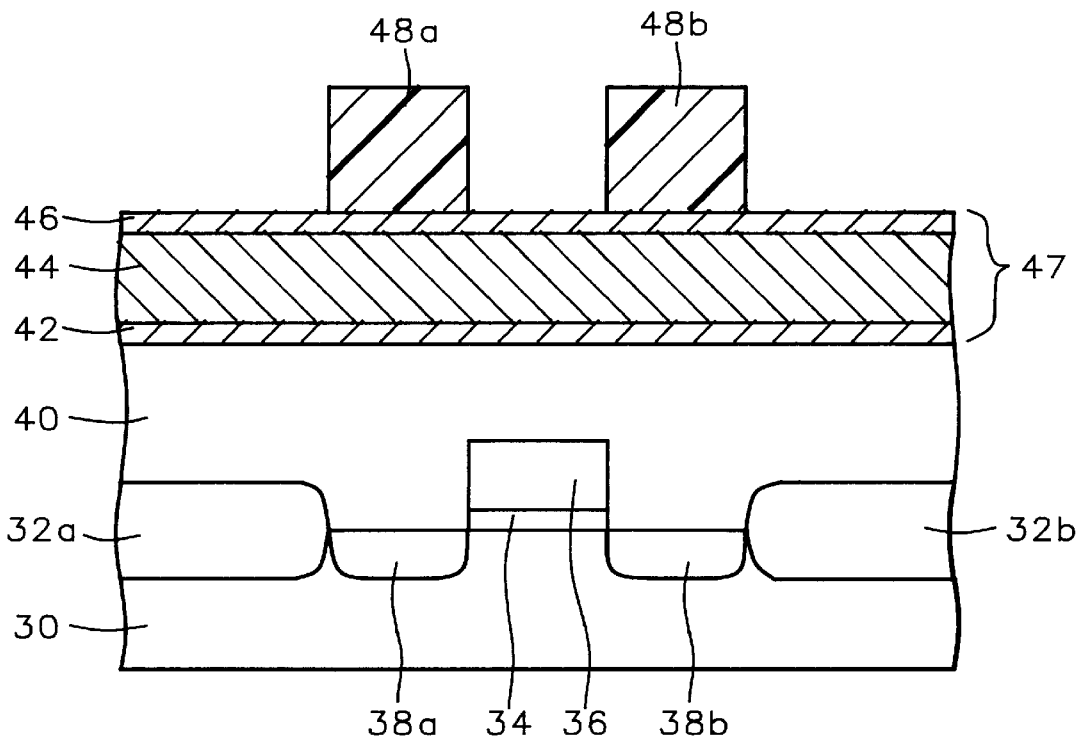
FIG. 3 to FIG. 8 show a series of schematic cross-sectional diagrams illustrating the results of progressive stages in forming within an integrated circuit integrated circuit structures from whose surfaces are removed metal-fluoropolymer residues through the preferred embodiment of the method of the present invention.

Referring now to FIG. 3 to FIG. 8, there is shown a series of schematic cross-sectional diagrams illustrating the results of progressive stages in forming within an integrated circuit integrated circuit structures from whose surfaces are removed metal-fluoropolymer residues through the preferred embodiment of the method of the present invention. Shown in FIG. 3 is a schematic cross-sectional diagram of the integrated circuit at an early stage in its fabrication.

Shown in FIG. 3 is a semiconductor substrate 30 having formed within and upon its surface a pair of isolation regions 32a and 32b which define the active region of the semiconductor substrate 30. Although semiconductor substrates are in general known with either dopant polarity, various dopant concentrations and several crystallographic orientations, for the preferred embodiment of the method of the present invention the semiconductor substrate 30 is preferably a (100) silicon semiconductor substrate having an N– or P– doping. Similarly, although it is also known in the art that isolation regions may be formed within and/or upon semiconductor substrates to define active regions of those semiconductor substrates through methods including but not limited to isolation region growth methods and isolation region deposition/patterning methods, for the preferred embodiment of the method of the present invention the isolation regions 32a and 32b are preferably formed through an isolation region thermal growth method at a temperature of from about 900 to about 1100 degrees centigrade to form isolation regions 32a and 32b of silicon oxide within and upon the semiconductor substrate 30.

There is also shown in FIG. 3, within the active region of the semiconductor substrate 30, several structures which comprise a field effect transistor (FET). The structures include a gate dielectric layer 34, a gate electrode 36 and a pair of source/drain regions 38a and 38b. The structures which comprise the field effect transistor (FET) within the active region of the semiconductor substrate 30 may be formed through methods as are conventional in the art of integrated circuit fabrication. Conventionally, gate dielectric layers are typically formed within integrated circuits through patterning, through methods as are conventional in the art, of blanket gate dielectric layers formed through methods including but not limited to blanket gate dielectric layer thermal growth methods and blanket gate dielectric layer deposition methods. Similarly, gate electrodes are typically formed within integrated circuits through patterning, through methods as are conventional in the art, of blanket gate electrode material layers formed of gate electrode materials including but not limited to metals, metal alloys, highly doped polysilicon and polycides (highly doped polysilicon/metal silicide stacks). Finally, source/drain regions within field effect transistors (FETs) for use within integrated circuits are typically formed through ion implanting a dopant of suitable polarity into the active region of a semiconductor substrate at an ion implantation dose and an ion implantation energy suitable to form a source/drain region within a field effect transistor (FET).

For the preferred embodiment of the method of the present invention, the gate dielectric layer 34 is preferably formed through patterning, through plasma etch methods as are conventional in the art, of a blanket gate dielectric layer formed through thermal oxidation of the active region of the semiconductor substrate 30 at a temperature of about 900 to about 1100 degrees centigrade to yield a gate dielectric layer 34 of silicon oxide at a thickness of about 125 to about 165 angstroms. Similarly, the gate electrode 36 is preferably formed through patterning, through methods as are conventional in the art, of a blanket polysilicon or polycide gate electrode material layer to form the gate electrode 36 of polysilicon or a polycide at a thickness of from about 3000 to about 5000 angstroms formed and aligned upon the gate dielectric layer 34. Finally, the source/drain regions 38a and 38b are preferably formed through ion implanting, while employing the gate dielectric layer 34 and the gate electrode 36 as a mask, a suitable dopant into the active region of the semiconductor substrate 30 at an ion implantation dose of from about 2E15 to about 3E15 ions per square centimeter and an ion implantation energy of from about 70 to about 80 keV.

There is also shown in FIG. 3 the presence of a planarized pre-metal dielectric (PMD) layer 40 formed over the semiconductor substrate 30 including the structures which comprise the field effect transistor (FET). Methods and materials through which planarized pre-metal dielectric (PMD) layers may be formed within integrated circuits are known in the art of integrated circuit fabrication. Planarized pre-metal dielectric layers are typically formed within integrated circuits through planarizing, through methods as are conventional in the art, of conformal dielectric layers formed within those integrated circuits. In turn, conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal dielectric layers of dielectric materials including but not limited to silicon oxide dielectric materials, silicon nitride dielectric materials and silicon oxynitride dielectric materials. For the preferred embodiment of the method of the present invention, the planarized pre-metal dielectric (PMD) layer 40 is preferably formed from a conformal dielectric layer formed of a silicon oxide dielectric material deposited through a plasma enhanced chemical vapor deposition (PECVD) method and planarized through a chemical mechanical polish (CMP) planarizing method or a reactive ion etch (RIE) etchback planarizing method, as is common in the art. Preferably, the planarized pre-metal dielectric (PMD) layer 40 so formed is from about 6000 to about 9000 angstroms thick.

There is also shown in FIG. 3 the presence of a series of three blanket conductor layers which form a blanket conductor stack layer 47 formed upon the planarized pre-metal dielectric (PMD) layer 40. The three blanket conductor layers within the blanket conductor stack layer 47 are: (1) a blanket lower barrier layer 42 formed upon the planarized pre-metal dielectric (PMD) layer 40; (2) a blanket conductor layer 44 formed upon the blanket lower barrier layer 42; and (3) a blanket anti-reflective coating (ARC) layer 46 formed upon the blanket conductor layer 44. For the preferred embodiment of the method of the present invention, the blanket lower barrier layer 42 and the blanket anti-reflective coating (ARC) layer 46 are preferably titanium containing layers formed of any titanium containing material from which a titanium containing blanket barrier layer or a titanium containing blanket anti-reflective coating (ARC) layer is conventionally formed within an integrated circuit. Such titanium containing materials include but are not limited to titanium metal, titanium nitride and titanium-tungsten alloys. Most preferably, the blanket lower barrier layer 42 is formed of a titanium-tungsten alloy. Similarly, for the preferred embodiment of the method of the present invention the blanket conductor layer 44 is preferably a blanket conductor layer formed of an aluminum containing conductor material.

For a general embodiment of the method of the present invention, at least one of a blanket conductor layer, a blanket lower barrier layer and a blanket anti-reflective coating (ARC) layer within a blanket conductor stack layer, such as the blanket conductor stack layer 47, is patterned through a fluorocarbon containing plasma in a fashion employing which there is formed metal-fluoropolymer residues along the sidewalls of a patterned conductor stack layer formed from the blanket conductor stack layer. Typically and preferably, the blanket lower barrier layer within the blanket conductor stack layer will be so patterned through the fluorocarbon containing plasma.

Methods and materials through which all of the blanket conductor layers within the blanket conductor stack layer 47 may be formed are conventional in the art of integrated circuit fabrication. All of the blanket conductor layers may be formed through methods including but not limited to thermally assisted evaporation methods, electron beam assisted evaporation methods, and physical vapor deposition (PVD) sputtering methods. For the preferred embodiment of the method of the present invention, each of the blanket conductor layers within the blanket conductor stack layer 47 is preferably formed through a physical vapor deposition (PVD) sputtering method, as is common in the art. Preferably, the blanket lower barrier layer 42 is formed to a thickness of from about 1000 to about 1600 angstroms, the blanket conductor layer 44 is formed to a thickness of from about 4000 to about 9000 angstroms and the blanket anti-reflective coating (ARC) layer 46 is formed to a thickness of from about 200 to about 500 angstroms.

Finally, there is also shown in FIG. 3 the presence of a pair of patterned first photoresist layers 48a and 48b formed upon the blanket conductor stack layer 47. The patterned first photoresist layers 48a and 48b are employed as a first etch mask layer in forming from the blanket conductor stack layer 47 a pair of patterned conductor stack layers. Although any of several photoresist materials may be employed in forming the patterned first photoresist layers 48a and 48b, including photoresist materials chosen from the general group of photoresist materials including positive photoresist materials and negative photoresist materials, for the preferred embodiment of the method of the present invention the patterned first photoresist layers 48a and 48b are preferably formed of a positive novolak photoresist material, as is most commonly employed in the art to form patterned photoresist layers of dimensional integrity at linewidths and aperture widths as low as about 0.35 microns. Other photoresist materials may however be employed in forming the patterned first photoresist layers 48a and 48b. Preferably, the patterned first photoresist layers 48a and 48b are from about 18000 to about 20000 angstroms thick each.

Figure 4:
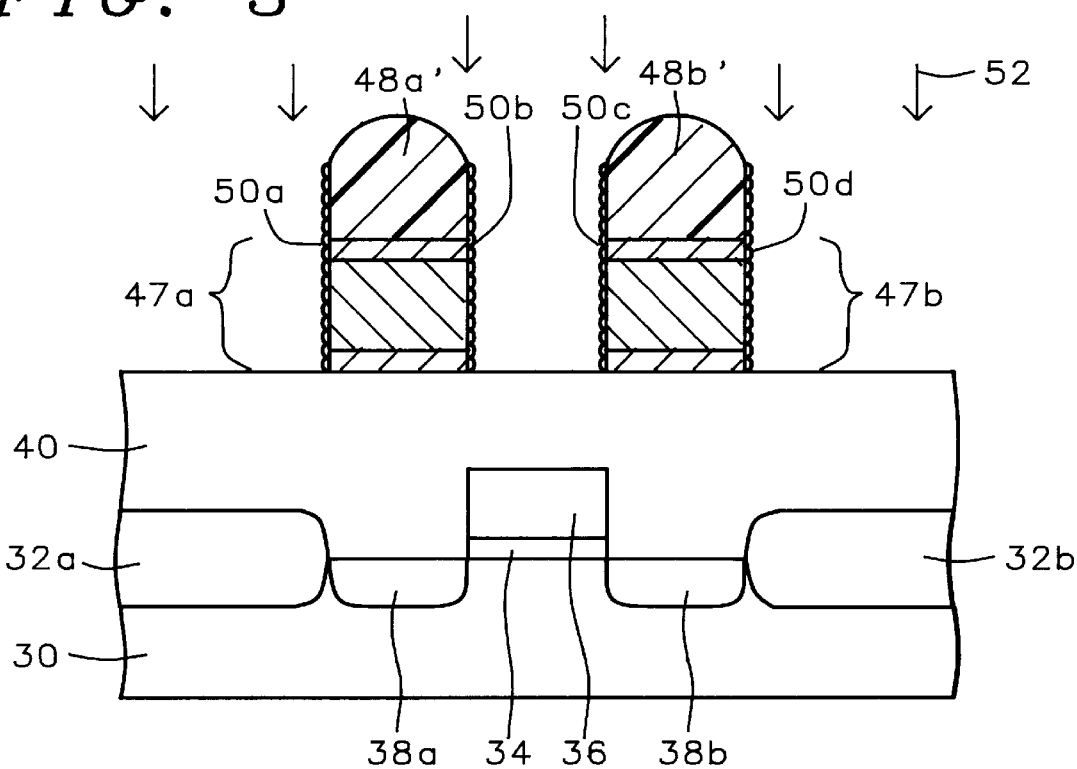

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of patterning through a first plasma etch method employing a first plasma 52 the blanket conductor stack layer 47 to form the patterned conductor stack layers 47a and 46b. When patterning the blanket conductor stack layer 47 to form the patterned conductor stack layers 47a and 47b through the first plasma etch method employing the first plasma 52, the patterned first photoresist layers 48a and 48b are etched somewhat, as shown in FIG. 4, to form the etched patterned first photoresist layers 48a' and 48b'. In addition, since there is typically employed within the first plasma etch method employing the first plasma 52 a fluorocarbon containing plasma for etching through the blanket lower barrier layer 42 when formed of a titanium containing material, there is formed the metal-fluoropolymer residues 50a, 50b, 50c and 50d adjoining the sidewalls of the patterned conductor stack layers 47a and 47b and the etched patterned first photoresist layers 48a' and 48b'.

Since the blanket conductor stack layer 47 within the preferred embodiment of the method of the present invention is formed of a composite of blanket conductor layers, the first plasma 52 employed in forming the patterned conductor stack layers 47a and 47b from the blanket conductor stack layer 47 is preferably undertaken through several sequential steps employing different etch parameters and etchant gas compositions. Thus, within the first plasma 52 employed within the preferred embodiment of the present invention, there are four sequential etch steps including: (1) a breakthrough etch step through which is patterned the blanket anti-reflective coating (ARC) layer 46; (2) a main etch step and an over etch step through which is patterned the blanket conductor layer 44; and (3) a final etch step through which is patterned the blanket lower barrier layer 42. The breakthrough etch step, the main etch step and the over etch step preferably employ an etchant gas composition comprising boron trichloride (BCl3), chlorine (Cl2) and nitrogen (N2), while the final etch step preferably employs an etchant gas composition comprising carbon tetrafluoride (CF4) and sulfur hexafluoride (SF6).

For the preferred embodiment of the method of the present invention, the breakthrough etch step is preferably employed at: (1) a reactor chamber pressure of from about 20 to about 40 mtorr; (2) a radio frequency power of from about 200 to about 400 watts at a radio frequency of 13.56 MHZ; (3) a magnetic field strength of from about 0 to about 10 gauss; (4) a substrate temperature of from about 70 to about 90 degrees centigrade; (5) a boron trichloride flow rate of from about 20 to about 40 standard cubic centimeters per minute (sccm); (6) a chlorine flow rate of from about 10 to about 20 standard cubic centimeters per minute (sccm); and (7) a nitrogen flow rate of from about 10 to about 20 standard cubic centimeters per minute (sccm), for a time period of from about 30 to about 50 seconds.

Similarly, for the preferred embodiment of the method of the present invention, the main etch step is preferably employed at: (1) a reactor chamber pressure of from about 80 to about 150 mtorr; (2) a radio frequency power of from about 400 to about 600 watts at a radio frequency of 13.56 MHZ; (3) a magnetic field strength of from about 40 to about 80 gauss; (4) a substrate temperature of from about 70 to about 90 degrees centigrade; (5) a boron trichloride flow rate of from about 45 to about 65 standard cubic centimeters per minute (sccm); (6) a chlorine flow rate of from about 40 to about 60 standard cubic centimeters per minute (sccm); and (7) a nitrogen flow rate of from about 5 to about 10 standard cubic centimeters per minute (sccm), for a time period determined through an endpoint detection method such as, but not limited to, an optical endpoint detection method or a residual gas analysis (RGA) endpoint detection method.

Yet similarly, for the preferred embodiment of the method of the present invention, the over etch step is preferably employed at: (1) a reactor chamber pressure of from about 15 to about 25 mtorr; (2) a radio frequency power of from about 100 to about 300 watts at a radio frequency of 13.56 MHZ; (3) a magnetic field strength of from about 15 to about 25 gauss; (4) a substrate temperature of from about 70 to about 90 degrees centigrade; (5) a boron trichloride flow rate of from about 20 to about 40 standard cubic centimeters per minute (sccm); (6) a chlorine flow rate of from about 5 to about 15 standard cubic centimeters per minute (sccm); and (7) a nitrogen flow rate of from about 10 to about 20 standard cubic centimeters per minute (sccm), for a time period of from about 45 to about 75 seconds.

Finally, for the preferred embodiment of the method of the present invention, the final etch step through which the blanket lower barrier layer 42 is patterned is preferably employed at: (1) a reactor chamber pressure of from about 20 to about 40 mtorr; (2) a radio frequency power of from about 100 to about 300 watts at a radio frequency of 13.56 MHZ; (3) a magnetic field strength of from about 40 to about 60 gauss; (4) a substrate temperature of from about 70 to about 90 degrees centigrade; (5) a carbon tetrafluoride flow rate of from about 20 to about 40 standard cubic centimeters per minute (sccm); and (6) a sulfur hexafluoride flow rate of from about 30 to about 50 standard cubic centimeters per minute (sccm), for a time period of from about 30 to about 50 seconds.

It is believed that the first metal-fluoropolymer residues 50a, 50b, 50c and 50d are largely formed during the final etch step when the fluorocarbon containing etchant gas composition is employed in patterning the blanket lower barrier layer 42. Typically, the first metal-fluoropolymer residues 50a, 50b, 50c and 50d so formed are from about 100 to about 500 angstroms thick.

Figure 5:
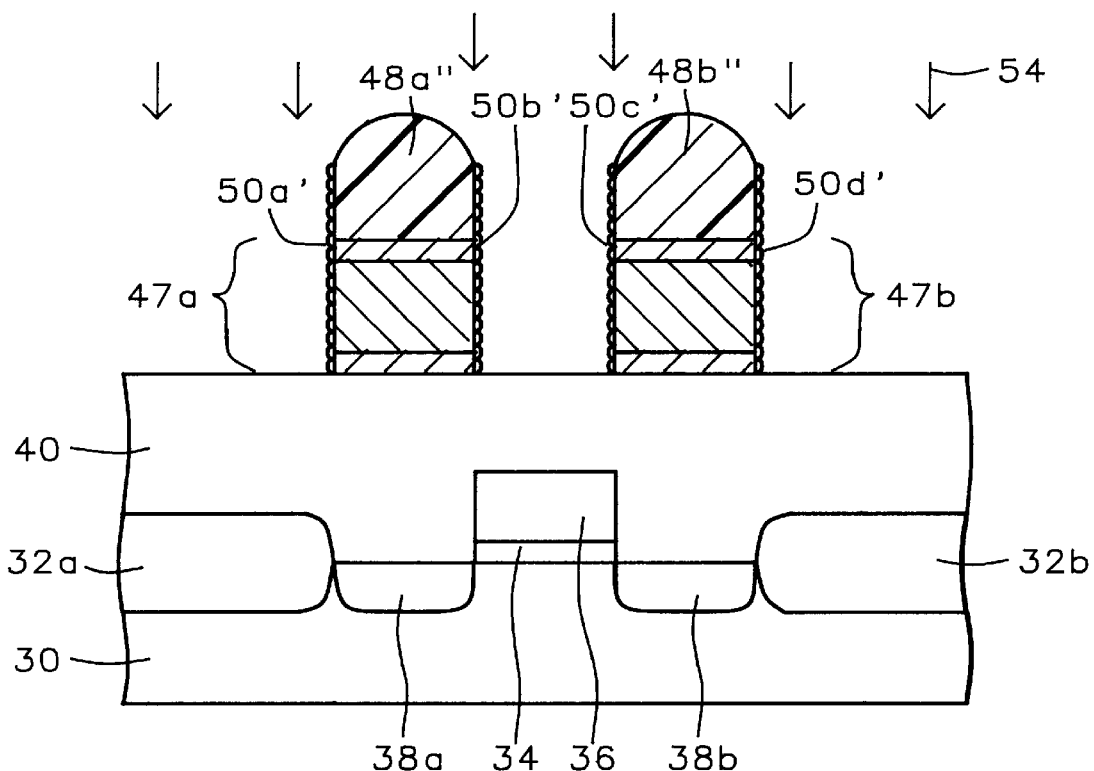

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit otherwise equivalent to the integrated circuit whose schematic cross-sectional diagram is illustrated in FIG. 4, but within which the first metal-fluoropolymer residues 50a, 50b, 50c and 50d are treated with a second plasma 54 which employs a chlorine containing etchant gas composition to form the chlorine containing plasma treated first metal-fluoropolymer residues 50a', 50b', 50c' and 50d'. There is also simultaneously formed the chlorine containing plasma treated etched patterned first photoresist layers 48a" and 48b" from the etched patterned first photoresist layers 48a' and 48b'. While the mechanism through which the second plasma 54 employing the chlorine containing etchant gas composition modifies the first metal-fluoropolymer residues 50a, 50b, 50c and 50d in forming the chlorine containing plasma treated first metal-polymer residues 50a', 50b', 50c' and 50d is not entirely clear, it is nonetheless clear that the chlorine containing plasma treated first metal-fluoropolymer residues 50a', 50b', 50c' and 50d' are more readily removed from the integrated circuit structure whose schematic cross-sectional diagram is illustrated in FIG. 5 through a stripping method sequentially employing an aqueous acid solution followed by an organic solvent, than are the first metal-fluoropolymer residues 50a, 50b, 50c and 50d removed from the integrated circuit structure whose schematic cross-sectional diagram is illustrated within FIG. 4 through an equivalent stripping method sequentially employing an aqueous acid solution followed by an organic solvent.

For the preferred embodiment of the method of the present invention, the second plasma etch method employing the second plasma 54 is preferably employed at: (1) a reactor chamber pressure of from about 20 to about 40 mtorr; (2) a radio frequency power of from about 200 to about 400 watts at a radio frequency of 13.56 MHZ; (3) a magnetic field strength of from about 15 to about 25 gauss; (4) a substrate temperature of from about 70 to about 90 degrees centigrade; (5) a boron trichloride flow rate of from about 25 to about 35 standard cubic centimeters per minute (sccm); (6) a chlorine flow rate of from about 5 to about 15 standard cubic centimeters per minute (sccm); and (7) a nitrogen flow rate of from about 10 to about 20 standard cubic centimeters per minute (sccm), for a comparatively short time period of from about 5 to about 10 seconds. Within this time period there is formed from the first metal-fluoropolymer residues 50a, 50b, 50c and 50d chlorine containing plasma treated first metal-fluoropolymer residues 50a', 50b', 50c' and 50d' which are readily removed from the sidewalls of the patterned conductor stack layers 47a and 47b through a stripping method sequentially employing an aqueous acid solution followed by an organic solvent.

Figure 6:
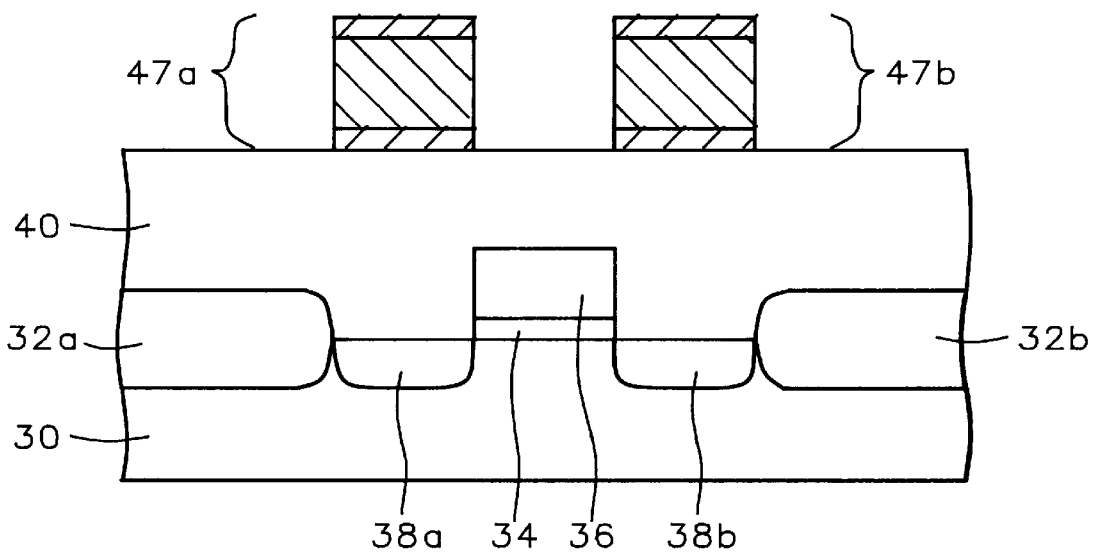

Referring now to FIG. 6, there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit otherwise equivalent to the integrated circuit whose schematic cross-sectional diagram is illustrated in FIG. 5, but from whose surface has been stripped the chlorine containing plasma treated etched patterned photoresist layers 48a" and 48b" and the chlorine containing plasma treated first metal-fluoropolymer residues 50a', 50b', 50c' and 50d'. For the preferred embodiment of the method of the present invention, the chlorine containing plasma treated etched patterned photoresist layers 48a" and 48b" and the chlorine containing plasma treated first metal-fluoropolymer residues 50a', 50b', 50c' and 50d' are stripped from the integrated circuit whose schematic cross-sectional diagram is illustrated by FIG. 5 to yield the integrated circuit whose schematic cross-sectional diagram is illustrated by FIG. 6 through a stripping method sequentially employing an aqueous acid solution followed by an organic solvent. Typically, the aqueous acid solution employs acids such as hydrofluoric acid, while the organic solvent may include, but is not limited to, N-methylpyrrolidone (NMP), tetrahydrofuran (THF) and acetone.

Figure 7:
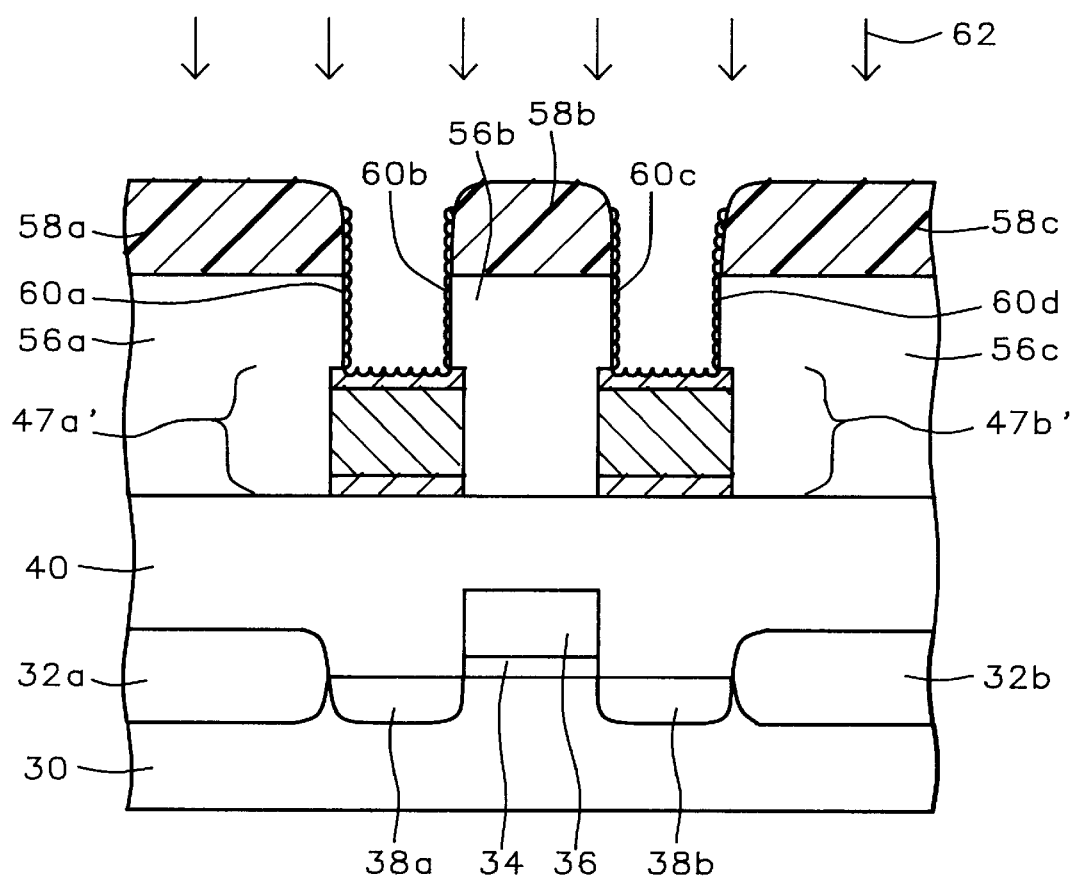
Figure 8:
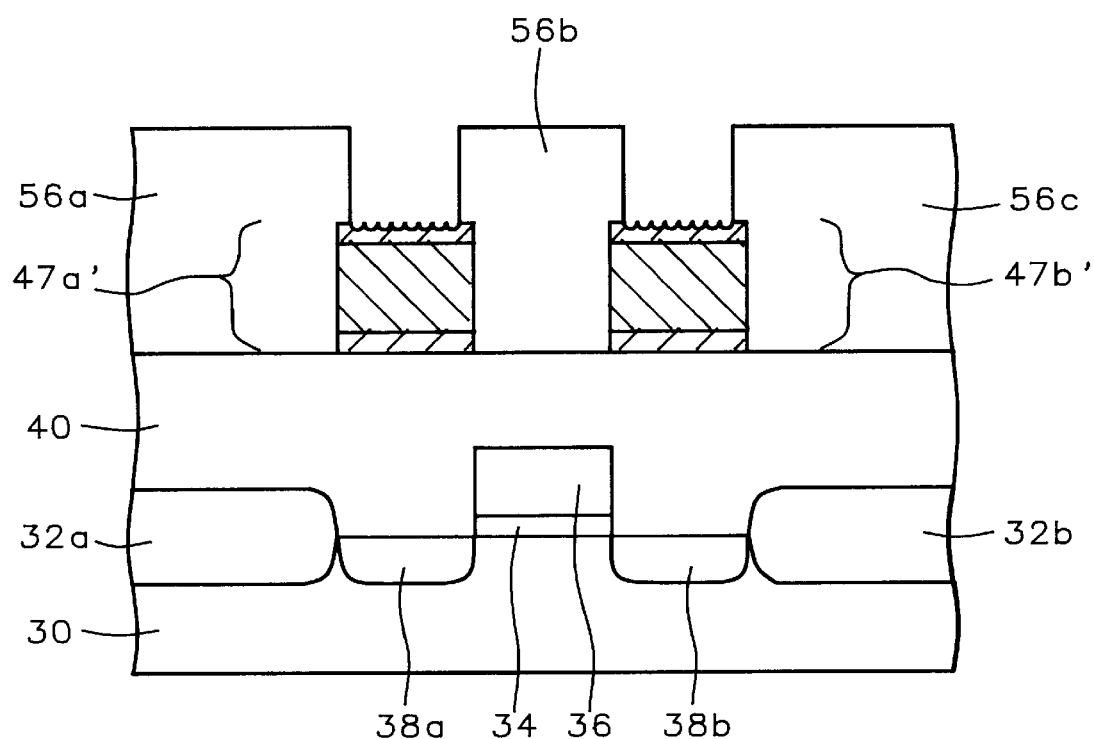

As is understood by a person skilled in the art, and as is suggested above within the Description of the Related Art, the method of the present invention may be employed in removing from integrated circuit structures metal-fluoropolymer residues formed in locations other than the sidewalls of patterned conductor stack layers which are formed within those integrated circuits. In that regard, there is shown in FIG. 7 and FIG. 8 a pair of schematic cross-sectional diagrams illustrating the results of progressive stages in forming and removing from the sidewalls of a series of patterned inter-metal dielectric (IMD) layers a series of second metal-fluoropolymer residues. FIG. 7 and FIG. 8 follow from FIG. 6.

Shown in FIG. 7 is a schematic cross-sectional diagram of an integrated circuit otherwise equivalent to the integrated circuit whose schematic cross-sectional diagram is illustrated in FIG. 6, but upon whose surface is formed a series of patterned inter-metal dielectric (IMD) layers 56a, 56b and 56c. The patterned inter-metal dielectric layers 56a, 56b and 56c are formed through a third plasma etch method employing a third plasma 62, where a blanket inter-metal dielectric (IMD) layer (not shown) is patterned while employing the etched patterned second photoresist layers 58a, 58b and 58c as a second etch mask layer. The blanket inter-metal dielectric (IMD) layer is preferably formed through methods and materials analogous to the methods and materials employed in forming the planarized pre-metal dielectric (PMD) layer 40. More preferably, the blanket inter-metal dielectric (IMD) layer is also formed of a silicon oxide dielectric material deposited through a plasma enhanced chemical vapor deposition (PECVD) method. Preferably, the blanket inter-metal dielectric (IMD) layer is planarized to a thickness of from about 8000 to about 10000 angstroms. Preferably, the etched patterned second photoresist layers 58a, 58b and 58c are formed employing methods, materials and dimensions analogous to the methods materials and dimensions employed in forming the etched patterned first photoresist layers 48a' and 48b', as illustrated in FIG. 4.

Since the blanket inter-metal dielectric (IMD) layer is preferably formed of a silicon oxide dielectric material, the third plasma 62 employed in forming the patterned inter-metal dielectric (IMD) layers 56a, 56b and 56c from the blanket inter-metal dielectric layer employs a fluorocarbon containing etchant gas composition, preferably a carbon tetrafluoride and/or trifluoromethane containing etchant gas composition. Thus, when forming the patterned inter-metal dielectric (IMD) layers 56a, 56b and 56c, there is an etching within the patterned conductor stack layers 47a and 47b of the patterned upper barrier layers formed of a titanium containing material to form the etched patterned conductor stack layers 47a' and 47b' while simultaneously forming the second metal-fluoropolymer residues 60a, 60b, 60c and 60d upon the sidewalls of the apertures defined by the patterned inter-metal dielectric (IMD) layers 56a, 56b and 56c and the etched patterned second photoresist layers 58a, 58b and 58c.

When forming the patterned inter-metal dielectric (IMD) layers 56a, 56b and 56c from the blanket inter-metal dielectric (IMD) layer, the third plasma 62 is preferably employed at: (1) a reactor chamber pressure of from about 700 to about 900 mtorr; (2) a radio frequency power of from about 600 to about 800 watts at a radio frequency of 13.56 MHZ; (3) a substrate temperature of from about −20 to about +20 degrees centigrade; (4) a carbon tetrafluoride flow rate of from about 10 to about 40 standard cubic centimeters per minute (sccm); (5) a trifluoromethane flow rate of from about 10 to about 40 standard cubic centimeters per minute (sccm); and (6) an argon flow rate of from about 400 to about 600 standard cubic centimeters per minute (sccm), for a time sufficient to completely etch through the blanket inter-metal dielectric (IMD) layer plus about 80 to about 120 percent over etch.

Referring now to FIG. 8, there is shown a schematic cross-sectional diagram illustrating the results of further processing of the integrated circuit whose schematic cross-sectional diagram is illustrated in FIG. 7. Shown in FIG. 8 is a schematic cross-sectional diagram of an integrated circuit otherwise equivalent to the integrated circuit whose schematic cross-sectional diagram is illustrated in FIG. 7 but from whose surface is removed the etched patterned second photoresist layers 58a, 58b and 58c, and the second metal-fluoropolymer residues 60a, 60b, 60c and 60d. The etched patterned second photoresist layers 58a, 58b and 58c, and the second metal-fluoropolymer residues 60a, 60b, 60c and 60d, are preferably removed through methods analogous or equivalent to the methods employed in removing the etched patterned first photoresist layers 48a' and 48b', and the first metal-fluoropolymer residues 50a, 50b, 50c and 50d from the integrated circuit whose schematic cross-sectional diagram is illustrated in FIG. 4. The methods will include a fourth plasma (not shown) equivalent to the second plasma 54 which employs a chlorine containing etchant gas composition, followed by a stripping method sequentially employing an aqueous acid solution followed by an organic solvent.

Thus, through the method of the present invention there may be removed from integrated circuit structures within various locations within integrated circuits metal-fluoropolymer residues with minimal process complexity.

EXAMPLES

Upon each semiconductor substrate within a pair of semiconductor substrates was formed a blanket pre-metal dielectric (PMD) layer of silicon oxide deposited through a plasma enhanced chemical vapor deposition (PECVD) method employing tetra-ethyl-ortho-silicate (TEOS) as a silicon source material. Upon each blanket pre-metal dielectric (PMD) layer was formed a blanket conductor stack layer formed of: (1) a blanket lower barrier layer of titanium-tungsten alloy at a thickness of about 1000 angstroms; (2) a blanket middle conductor layer formed of an aluminum-copper-silicon alloy at a thickness of about 6500 angstroms; and (3) a blanket anti-reflective coating layer formed of titanium nitride at a thickness of about 350 angstroms. Each of the blanket layers within the blanket conductor stack layers was formed through a physical vapor deposition (PVD) sputtering method as is conventional in the art.

Upon each of the blanket conductor stack layers was then formed a patterned photoresist layer formed of a positive novolak photoresist material through methods and with dimensions as are conventional in the art.

The exposed portions of the blanket conductor stack layers upon the series of semiconductor substrates were then etched to form patterned conductor stack layers through a first plasma etch method which employed a breakthrough etch step, a main etch step, an over etch step and a final etch step in accord with the parameters and etchant gas compositions as outlined within the preferred embodiment of the method of the present invention.

The breakthrough etch step was employed at: (1) a reactor chamber pressure of about 30 mtorr; (2) a radio frequency power of about 300 watts at a radio frequency of 13.56 MHZ; (3) a substrate temperature of about 80 degrees centigrade; (4) a boron trichloride flow rate of about 30 standard cubic centimeters per minute (sccm); (5) a chlorine flow rate of about 15 standard cubic centimeters per minute (sccm); and (6) a nitrogen flow rate of about 15 standard cubic centimeters per minute (sccm), for a time period of about 40 seconds.

Similarly, the main etch step was employed at: (1) a reactor chamber pressure of about 125 mtorr; (2) a radio frequency power of about 500 watts at a radio frequency of 13.56 MHZ; (3) a magnetic field strength of about 80 gauss;

(4) a substrate temperature of about 80 degrees centigrade; (5) a boron trichloride flow rate of about 55 standard cubic centimeters per minute (sccm); (6) a chlorine flow rate of about 50 standard cubic centimeters per minute (sccm); and (7) a nitrogen flow rate of about 7 standard cubic centimeters per minute (sccm), for a time period determined through an endpoint detection method conventional in the art.

Yet similarly, the over etch step was employed at: (1) a reactor chamber pressure of about 20 mtorr; (2) a radio frequency power of about 300 watts at a radio frequency of 13.56 MHZ; (3) a magnetic field of about 20 gauss; (4) a substrate temperature of about 80 degrees centigrade; (5) a boron trichloride flow rate of about 30 standard cubic centimeters per minute (sccm); (6) a chlorine flow rate of about 10 standard cubic centimeters per minute (sccm); and (7) a nitrogen flow rate of about 15 standard cubic centimeters per minute (sccm), for a time period of about 60 seconds.

Finally, the final etch step was employed at: (1) a reactor chamber pressure of about 30 mtorr; (2) a radio frequency power of about 300 watts at a radio frequency of 13.56 MHZ; (3) a magnetic field strength of about 50 gauss; (4) a substrate temperature of about 80 degrees centigrade; (5) a carbon tetrafluoride flow rate of about 30 standard cubic centimeters per minute (sccm); and (6) a sulfur hexafluoride flow rate of about 40 standard cubic centimeters per minute (sccm), for a time period of about 40 seconds.

Resulting from the first plasma etch method was metal-fluoropolymer residues adjoining the sidewalls of the patterned conductor stack layers.

One of the two semiconductor substrates was then exposed to a second plasma employing a chlorine containing etchant gas composition. The other semiconductor substrate received no additional plasma treatment.

The second plasma was employed at: (1) a reactor chamber pressure of about 30 mtorr; (2) a radio frequency power of about 300 watts at a radio frequency of 13.56 MHZ; (3) a magnetic field strength of about 20 gauss; (4) a substrate temperature of about 80 degrees centigrade; (5) a boron trichloride flow rate of about 30 standard cubic centimeters per minute (sccm); (6) a chlorine flow rate of about 10 standard cubic centimeters per minute (sccm); and (7) a nitrogen flow rate of about 15 standard cubic centimeters per minute (sccm), for a time period of about 5 seconds.

Each of the two semiconductor substrates was then exposed to a stripping method sequentially employing an aqueous acid solution followed by an organic solvent, in order to remove the patterned photoresist layers and the metal-fluoropolymer residues. The aqueous acid solution portion of the stripping method employed an aqueous acid at a temperature of about 105 degrees centigrade for a time period of about 25 minutes. The organic solvent portion of the stripping method employed N-methylpyrrolidone (NMP) solvent for a time period of about 7 minutes.

Each of the two semiconductor substrates was then inspected with the aid of a scanning electron microscope (SEM) to determine the average percentage of the metal-fluoropolymer residue removed from the patterned conductor stack layers. The results of the inspection are reported in Table I.

TABLE I

| Example | 2nd Plasma | Stripping Sol'n | Percent Polymer Removed |
|---|---|---|---|
| 1 | Yes | Acid + NMP | 100 |
| 2 | No | Acid + NMP | 20 |

From review of the data contained in Table I, it is seen that by employing the second plasma etch method employing the chlorine containing etchant gas composition in accord with the preferred embodiment of the method of the present invention, there is provided by the present invention a method through which metal-fluoropolymer residues may be readily removed from integrated circuit structures within integrated circuits.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples which are within the spirit and scope of the present invention, as defined by the accompanying claims.

What is claimed is:

1. A method for removing a metal-fluoropolymer residue from an integrated circuit structure within an integrated circuit comprising:

providing an integrated circuit structure comprising a conductor metal layer, the integrated circuit structure having formed thereupon a metal-fluoropolymer residue, the metal-fluoropolymer residue being formed incident to etching the conductor metal layer with a first plasma employing a fluorocarbon containing etchant gas composition;

treating the metal-fluoropolymer residue with a second plasma which employs a chlorine containing etchant gas composition to form a chlorine containing plasma treated metal-fluoropolymer residue; and stripping the chlorine containing plasma treated metal-fluoropolymer residue from the integrated circuit structure with an aqueous acid solution followed by an organic solvent.

2. The method of claim 1 wherein the metal-fluoropolymer residue has a thickness of from about 100 to about 500 angstroms.

3. The method of claim 1 wherein the chlorine containing etchant gas composition comprises boron trichloride and chlorine.

4. The method of claim 3 wherein the chlorine containing etchant gas composition is employed at:

a boron trichloride flow rate of from about 25 to about 35 standard cubic centimeters per minute (sccm);

a chlorine flow rate of from about 5 to about 15 standard cubic centimeters per minute (sccm);

a radio frequency power of from about 200 to about 400 watts; and an exposure time of from about 5 to about 10 seconds.

5. The method of claim 1 wherein the organic solvent is selected from the group of organic solvents consisting of N-methylpyrrolidone (NMP), tetrahydrofuran (THF) and acetone.

6. The method of claim 1 wherein the aqueous acid solution is an aqueous hydrofluoric acid solution.

7. A method for removing a metal-fluoropolymer residue from a patterned conductor metal layer within an integrated circuit comprising:

provide an integrated circuit having formed therein a patterned conductor metal layer, the patterned conductor metal layer having formed thereupon a metal-fluoropolymer residue, the metal-fluoropolymer residue being formed incident to etching the patterned conductor metal layer with a first plasma employing a fluorocarbon containing etchant gas composition;

treating the metal-fluoropolymer residue with a second plasma which employs a chlorine containing etchant gas composition to form a chlorine containing plasma treated metal-fluoropolymer residue; and stripping the chlorine containing plasma treated metal-fluoropolymer residue from the patterned conductor metal layer with an aqueous acid solution followed by an organic solvent.

8. The method of claim 7 wherein the metal-fluoropolymer residue has a thickness of from about 100 to about 500 angstroms.

9. The method of claim 7 wherein the chlorine containing etchant gas composition comprises boron trichloride and chlorine.

10. The method of claim 9 wherein the chlorine containing etchant gas composition is employed at:

a boron trichloride flow rate of from about 25 to about 35 standard cubic centimeters per minute (sccm);

a chlorine flow rate of from about 5 to about 15 standard cubic centimeters per minute (sccm);

a radio frequency power of from about 200 to about 400 watts; and an exposure time of from about 5 to about 10 seconds.

11. The method of claim 7 wherein the organic solvent is selected from the group of organic solvents consisting of N-methylpyrrolidone (NMP), tetrahydrofuran (THF) and acetone.

12. The method of claim 7 wherein the aqueous acid solution is an aqueous hydrofluoric acid solution.

13. A method for forming a patterned conductor metal layer within an integrated circuit comprising:

providing a semiconductor substrate having formed thereover a blanket conductor metal layer, the semiconductor substrate also having formed therein and thereupon integrated circuit devices;

etching, at least in part, the blanket conductor metal layer with a first plasma employing a fluorocarbon containing etchant gas composition to form a patterned conductor metal layer, the patterned conductor metal layer having formed upon a sidewall of the patterned conductor metal layer a metal-fluoropolymer residue, the metal-fluoropolymer residue being formed incident to etching the blanket conductor metal layer with the first plasma;

treating the metal-fluoropolymer residue with a second plasma which employs a chlorine containing etchant gas composition to form a chlorine containing plasma treated metal-fluoropolymer residue; and stripping the chlorine containing plasma treated metal-fluoropolymer residue from the integrated circuit with an aqueous acid solution followed by an organic solvent.

14. The method of claim 13 wherein the metal-fluoropolymer residue has a thickness of from about 100 to about 500 angstroms.

15. The method of claim 13 wherein the chlorine containing etchant gas composition comprises boron trichloride and chlorine.

16. The method of claim 15 wherein the chlorine containing etchant gas composition is employed at:

a boron trichloride flow rate of from about 25 to about 35 standard cubic centimeters per minute (sccm);

a chlorine flow rate of from about 5 to about 15 standard cubic centimeters per minute (sccm);

a radio frequency power of from about 200 to about 400 watts; and an exposure time of from about 5 to about 10 seconds.

17. The method of claim 13 wherein the organic solvent is selected from the group of organic solvents consisting of N-methylpyrrolidone (NMP), tetrahydrofuran (THF) and acetone.

18. The method of claim 13 wherein the aqueous acid solution is an aqueous hydrofluoric acid solution.

* * * * *